United States Patent
Miyata

(10) Patent No.: US 8,154,077 B2
(45) Date of Patent: Apr. 10, 2012

(54) SEMICONDUCTOR DEVICE

(75) Inventor: Toshitaka Miyata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/019,662

(22) Filed: Feb. 2, 2011

(65) Prior Publication Data
US 2011/0186925 A1    Aug. 4, 2011

(30) Foreign Application Priority Data

Feb. 2, 2010   (JP) ................ P2010-021074

(51) Int. Cl.
*H01L 29/76* (2006.01)
*H01L 23/62* (2006.01)

(52) U.S. Cl. ........ 257/335; 257/336; 257/356; 257/376; 257/E21.425; 257/E21.432; 257/E21.443; 438/197; 438/217; 438/268; 438/291

(58) Field of Classification Search .............. 257/335, 257/336, 356, 376, E21.425, E21.432, E21.443; 438/197, 217, 268, 291
See application file for complete search history.

(56) References Cited

U.S. PATENT DOCUMENTS

| | | | |
|---|---|---|---|
| 5,512,770 A * | 4/1996 | Hong ................ | 257/345 |
| 5,712,501 A * | 1/1998 | Davies et al. ......... | 257/335 |
| 6,822,297 B2 * | 11/2004 | Nandakumar et al. ...... | 257/356 |
| 7,042,051 B2 * | 5/2006 | Ootsuka et al. .......... | 257/345 |
| 7,354,817 B2 * | 4/2008 | Watanabe et al. ......... | 438/217 |
| 2004/0253790 A1 * | 12/2004 | Ootsuka .................. | 438/305 |
| 2008/0142885 A1 | 6/2008 | Mineji | |
| 2009/0166685 A1 | 7/2009 | Hokazono | |

FOREIGN PATENT DOCUMENTS

JP   2008-147548 A   6/2008
JP   2009-158853 A   7/2009

OTHER PUBLICATIONS

A. Hokazono et al., "Steep Channel & Halo Profiles Utilizing Boron-Diffusion Barrier Layers (Si:C) for 32 nm Node and Beyond", VLSI Technology Digest of Technical Papers, 2008, pp. 112-113.

* cited by examiner

*Primary Examiner* — Dao H Nguyen
(74) *Attorney, Agent, or Firm* — Turocy & Watson, LLP

(57) ABSTRACT

According to an embodiment, a semiconductor device includes a gate electrode formed on a semiconductor substrate via an insulating layer; a source region including an extension region, a drain region including an extension region, a first diffusion restraining layer configured to prevent a diffusion of the conductive impurity in the source region and including an impurity other than the conductive impurity, and a second diffusion restraining layer configured to prevent a diffusion of the impurity in the drain region and including the impurity other than the conductive impurity.

10 Claims, 9 Drawing Sheets

SEMICONDUCTOR DEVICE

CROSS REFERENCE TO RELATED APPLICATION

This application is based upon and claims the benefit of priority from Japanese Patent Application No. 2010-21074, filed on Feb. 2, 2010, the entire contents of which are incorporated herein by reference.

BACKGROUND

A transistor for reducing short channel effect is known. The transistor has C atom for reducing a diffusion of B.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
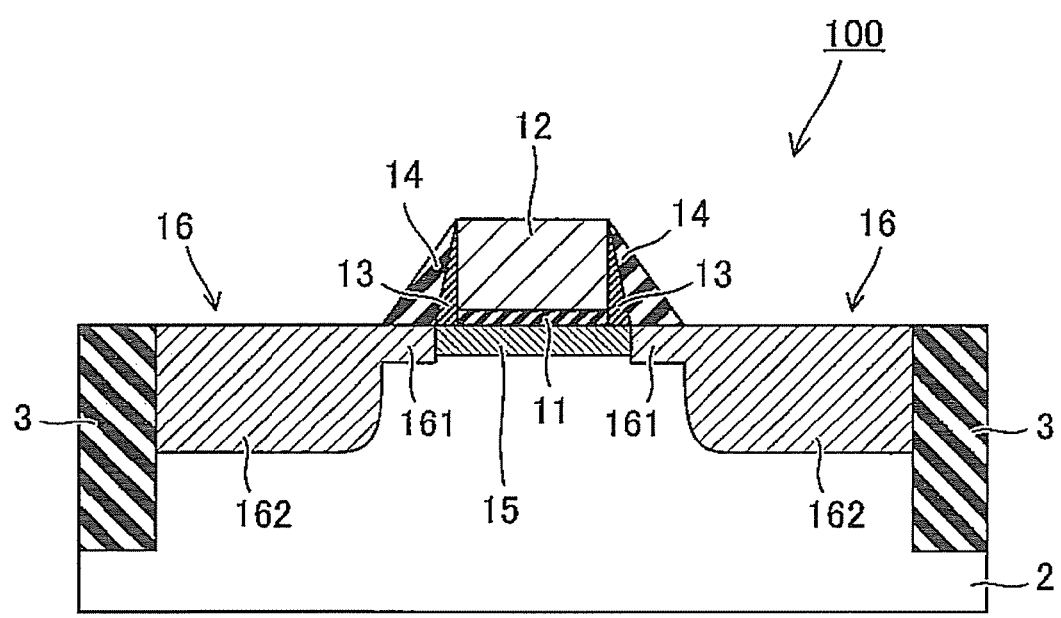
FIG. 1 is a cross sectional view of a semiconductor device in accordance with a first embodiment of the present invention.

According to an embodiment, a semiconductor device includes a gate electrode formed on a semiconductor substrate via an insulating layer, a source region formed in the semiconductor substrate and including an extension region in a side closer to the gate electrode and a conductive impurity, the extension region including a side surface facing a horizontal direction and a bottom surface facing a vertical direction, a drain region formed in the semiconductor substrate and including an extension region in a side closer to the gate electrode and the conductive impurity, the extension region including a side surface facing the horizontal direction and a bottom surface facing a vertical direction, a first diffusion restraining layer formed in the semiconductor substrate, configured to prevent a diffusion of the conductive impurity in the source region, and including an impurity other than the conductive impurity, the first diffusion restraining layer being in contact with the side surface of the extension region of the source region and not in contact with the bottom surface of the extension region of the source region, and a second diffusion restraining layer formed in the semiconductor substrate and configured to prevent a diffusion of the impurity in the drain region, and including the impurity other than the conductive impurity, the second diffusion restraining layer being in contact with the side surface of the extension region of the drain region and not in contact with the bottom surface of the extension region of the drain region.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

A first embodiment of the present invention will be explained hereinafter with reference to FIGS. 1-6.

FIG. 1 is a cross sectional view of a semiconductor device 100 in accordance with a first embodiment of the present invention. In the semiconductor device 100, an element isolation region (STI; Shallow Trench Isolation) 3 is formed in a semiconductor substrate (Si substrate) 2. A gate electrode 12 is formed on the semiconductor substrate 2 via a gate insulating layer 11. Offset spacers 13 are formed on sidewalls of the gate electrode 12 so as to sandwich the gate electrode 12. Gate sidewall layers 14 are formed on sidewalls of the offset spacers 12 so as to sandwich the gate electrode 12. A diffusion restraining layer 15 is formed in the semiconductor substrate 2 below the gate electrode 12. A source/drain region 16 is formed in the semiconductor substrate 2. The diffusion restraining layer 15 is formed between the source/drain regions 16.

A conductive impurity such as B or the like is included in the source/drain region 16. The source/drain region 16 includes an extension region 161 which is formed closer portion to the gate electrode 12 and a deeper region 162 of the source/drain region 16.

An impurity which prevents a diffusion of a conductive impurity in the source/drain region 16 is implanted in semiconductor substrate 2. The impurity in the diffusion restraining region 16 may be C in case the conductive impurity in the source/drain region 16 is B or P. The impurity in the diffusion restraining region 16 may be Xe in case the conductive impurity in the source/drain region 16 is As.

A mechanism for preventing a diffusion by the diffusion restraining layer 15 is explained with the case the conductive impurity in the source/drain region 16 is B and the impurity in the diffusion restraining layer 15 is C.

Some Si is moved to an interstitial from a lattice, when B is implanted into semiconductor substrate 2 so as to form the source/drain region 2. The Si in lattice tends to diffuse by pairing with B. on the other hand the C tends to pair with the Si in interstitial. So, the C paired to the Si in interstitial functions as restraining a diffusion of B.

The diffusion restraining layer 15 functions to preventing a diffusion of As, which is implanted into the semiconductor substrate 2 below the diffusion restraining layer 15 by controlling a threshold voltage of the transistor.

Figure 2A:
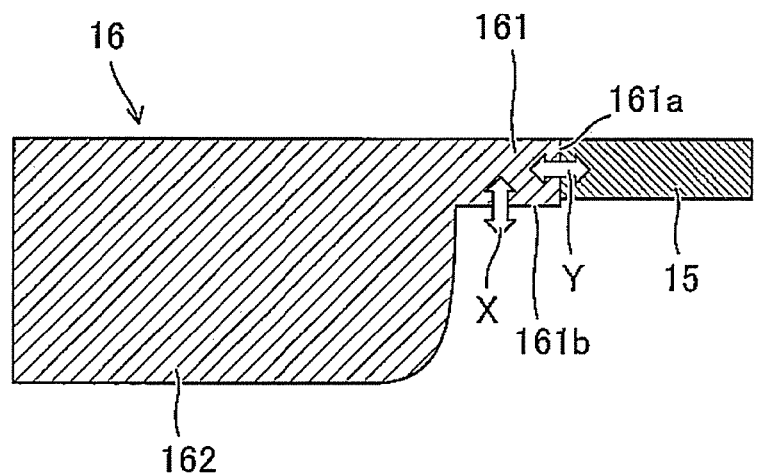
FIG. 2A is an enlarged view around a source/drain region of a semiconductor device in accordance with a first embodiment.

FIG. 2A is an enlarged view around the source/drain region 16. FIG. 2A shows one of the source/drain regions 16, but the other source/drain regions 16 is the same as shown in FIG. 2A.

The diffusion restraining layer 15 is in contact with a side surface 161a of the extension region (source/drain extension region) 161. The diffusion restraining layer 15 is not in contact with a bottom surface 161b of the extension region (source/drain extension region) 161. The impurity for preventing diffusion is not included in the extension region 161, since the extension region 161 is formed in a region where the diffusion restraining layer 15 is not formed. A small amount of the impurity may be included in the extension region 161, since the impurity may be diffused from the diffusion restraining layer 15. So the impurity concentration of the impurity is smaller in the extension region 161 than in the diffusion restraining layer 15. A diffusion of the conductive impurity in the extension region 161 is reduced horizontally, but not reduced vertically. This is the diffusion restraining layer 15 is not formed on the bottom surface 161b of the extension region 161.

Figure 2B:
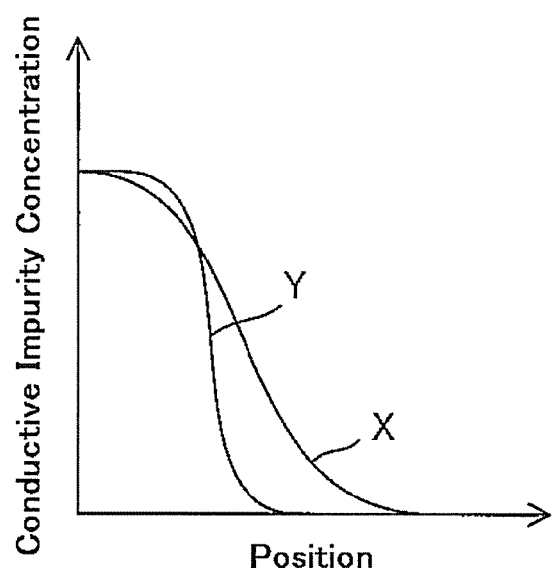
FIG. 2B is a graph showing a conductive impurity concentration in an extension region.

FIG. 2B is a graph showing a conductive impurity concentration of a direction X and a direction Y in FIG. 2A. The direction X is a vertical direction around a boundary between the extension region 161 and the semiconductor substrate 2. The direction Y is a horizontal direction around a boundary between the extension region 161 and the diffusion restraining layer 15.

As shown in FIG. 2B, the impurity concentration distribution of the conductive impurity in the side surface 161a of the extension region 161 to the horizontal direction (direction Y) is steeper than an impurity concentration distribution of the conductive impurity in the bottom surface 161b of the extension region 161 to the vertical direction (direction X). In other words, the conductive impurity in direction Y has a steep profile than in direction X.

The semiconductor substrate 2 is a Si substrate or the like.
The STI region 3 is made of a $SiO_2$ or the like.
The gate insulating layer 11 $SiO_2$, SiN, SiON, HfSiON, or high-K insulating material.
The gate electrode 12 is a polycrystalline Si including a conductive impurity, metal, or lamination of the metal and the polycrystalline Si.
The offset spacer 13 and the gate sidewall layer 14 are made of insulating materials including $SiO_2$, SiN or the like.

A manufacturing method of the semiconductor device 100 is explained with reference to FIGS. 3A-3F.

Figure 3A:
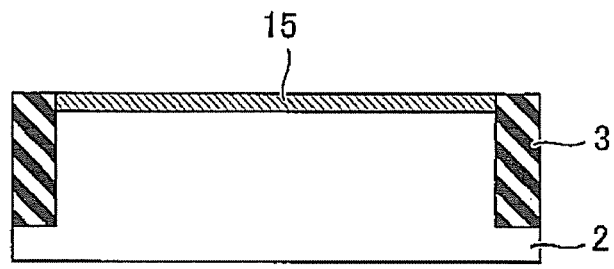
FIGS. 3A-3F are cross sectional views showing a manufacturing process of a semiconductor device in accordance with a first embodiment of the present invention.

As shown in FIG. 3A, the STI 3 is formed in the semiconductor substrate 2. Later that, C atom, which is the impurity so as to prevent diffusion, is implanted into a surface of the semiconductor substrate 2. Later that, a conductive impurity is implanted to the semiconductor substrate 2 so as to form a well region (not shown) and a channel region (not shown).

Figure 3B:
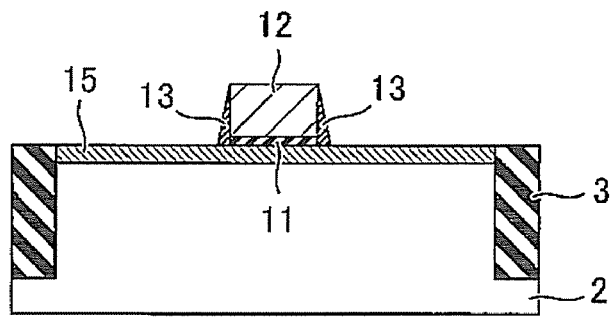

As shown in FIG. 3B, the gate insulating layer 11 and gate electrode 12 are formed and pattered, and the offset spacer 13 is formed on both sides of the gate electrode 12 by CVD or the like.

Figure 3C:
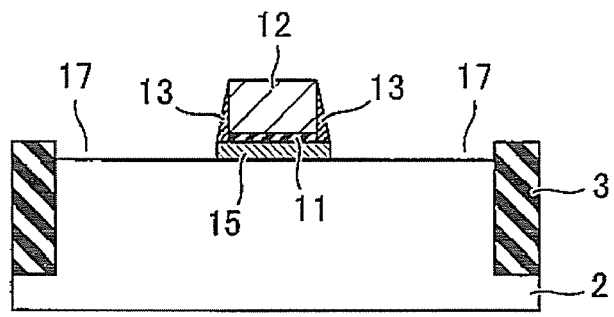

As shown in FIG. 3C, a trench 17 is formed by removing an exposed portion of the diffusion restraining layer 15. A portion of the diffusion restraining layer 15 in which the source/drain region 16 is to be formed is removed. A bottom of the trench 17 may be provided below the bottom of the diffusion restraining layer 15. A cap layer may be formed on the gate electrode 12.

Figure 3D:
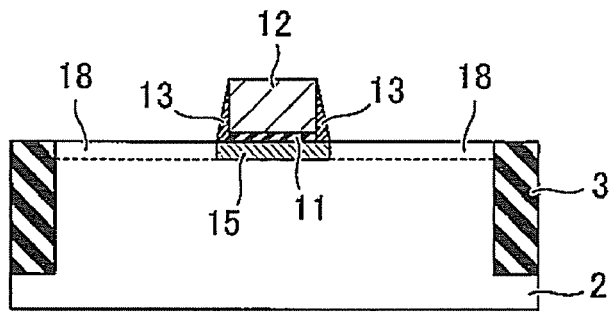

As shown in FIG. 3D, an epitaxial crystal layer 18 is grown on the trench 17.

Figure 3E:
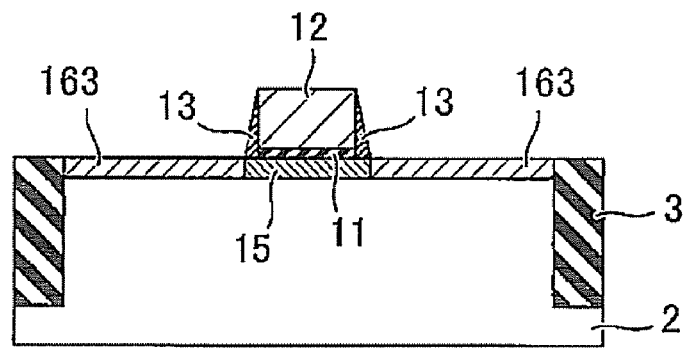

As shown in FIG. 3E, a shallow portion 163 of the source/drain region 16 is formed in the epitaxial crystal layer 18 and the semiconductor substrate 2. The shallow portion 163 of the source/drain region 16 is rarely formed in the diffusion restraining layer 15, since the outside portion from the offset spacer 13 of the diffusion restraining layer 15.

For example, the conductive impurity such as B is implanted to the semiconductor substrate 2 so as to form the shallow region 163 of the source/drain region 16 with using the offset spacer 13 and the gate electrode 12 as a mask.

Implanting energy is 0.5 keV and implant amount is $1.0 \times 10^{15}$ cm$^{-2}$, in case B is used as the impurity for P-type source/drain region 16.

The shallow region 163 of the source/drain region 16 may be formed as an in-situ doping epitaxial growth.

After forming the shallow region 163 of the source/drain region 16, annealing for activating the conductive impurity in the shallow region 163 may be provided. A horizontal diffusion of the conductive impurity is suppressed by the diffusion restraining layer 15. A vertical diffusion of the conductive impurity is not suppressed. Annealing process may be a spike anneal in 1050 degrees Celsius.

Figure 3F:
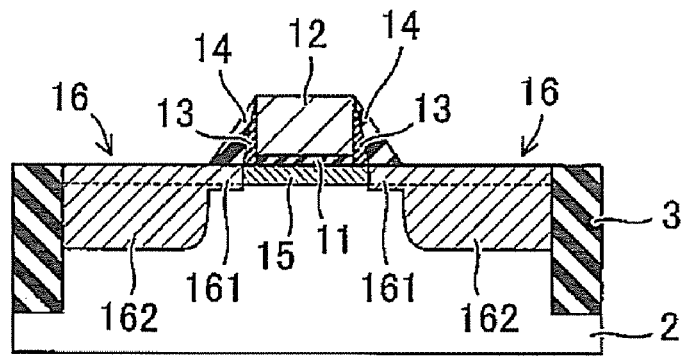

As shown in FIG. 3F, the gate sidewall layers 14 are formed on the semiconductor substrate 2 and a side of the offset spacer 13. After that, a deep layer 162 of the source/drain region 16 is formed by the gate electrode 12, offset spacer 13 and the sidewall layers 14 as mask. The region 161 of the source/drain region 16 where the deep region 162 is not formed is the extension region of the source/drain region 16.

Implanting energy is 15 keV and implant amount is $3.0 \times 10^{15}$ cm$^{-2}$, in case $BF_2$ is used as the impurity for the deep region 162 of the P-type source/drain region 16. After that annealing for activating the conductive impurity in the deep region 163 may be provided. A horizontal diffusion of the conductive impurity is suppressed by the diffusion restraining layer 15. A vertical diffusion of the conductive impurity is not suppressed. Annealing process may be a spike anneal in 1050 degrees Celsius.

A suicide layer may be formed on an upper surface of the source/drain region 16.

In accordance with this embodiment, the horizontal diffusion of the conductive impurity in the extension region 161 is suppressed. So, the short channel effect may be weakened. The vertical diffusion of the conductive impurity in the extension region 161 is not suppressed. So, the sufficient depth of the extension region 162 is obtained, and the parasitic resistance is not increased.

Figure 4A:
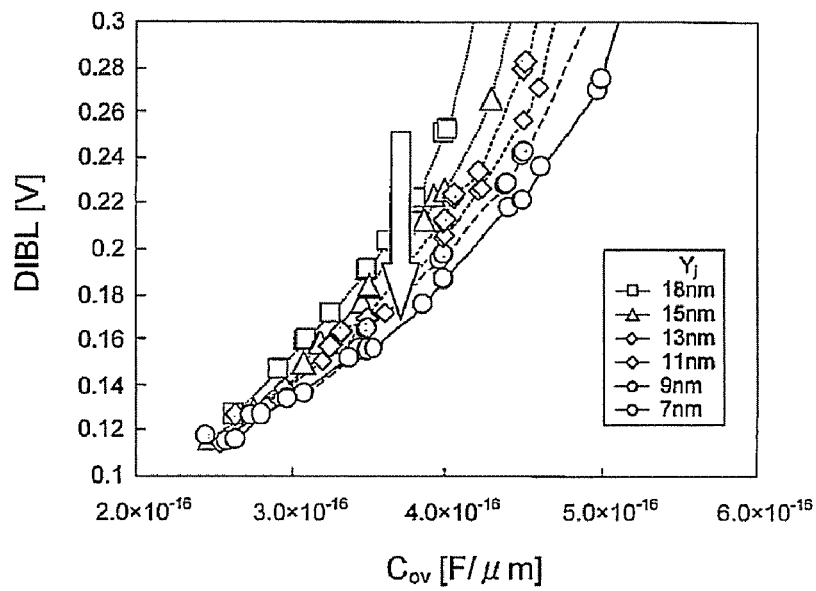
FIG. 4A is graph showing a relationship between the DIBL and Cov in accordance with a first embodiment.
Figure 4B:
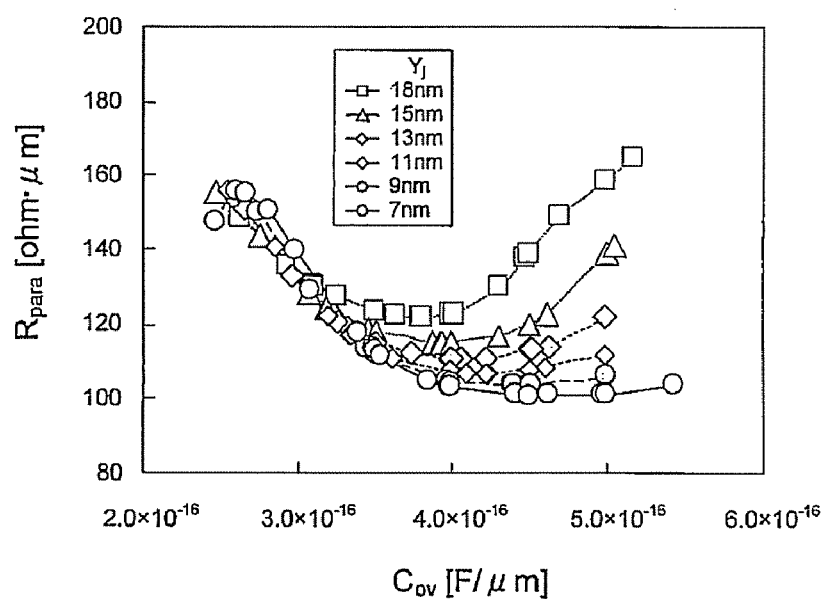
FIG. 4B is graph showing a relationship between the Rpara and Cov in accordance with a first embodiment.

FIG. 4A is graph showing a relationship between the DIBL and Cov in accordance with a first embodiment. As shown in FIG. 4A, DIBL is reduced with the Yj is decreased. Cov is overlap capacitance between the gate electrode 12 and the source/drain region 16. In FIG. 4B, the parasitic resistance Rpara is a parasitic resistance in the extension region 161. as shown in FIG. 4B, the Rpara is not increased if the Yj is decreased. So the parasitic resistance in the extension region is not increased in this embodiment.

Figure 5A:
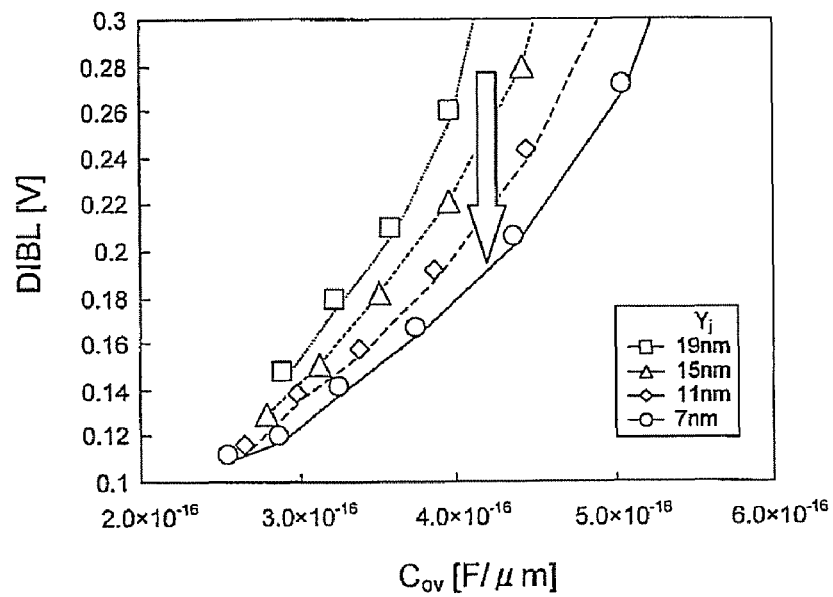
FIG. 5A is a graph showing a relationship between the DIBL and Cov in accordance with a comparative example.
Figure 5B:
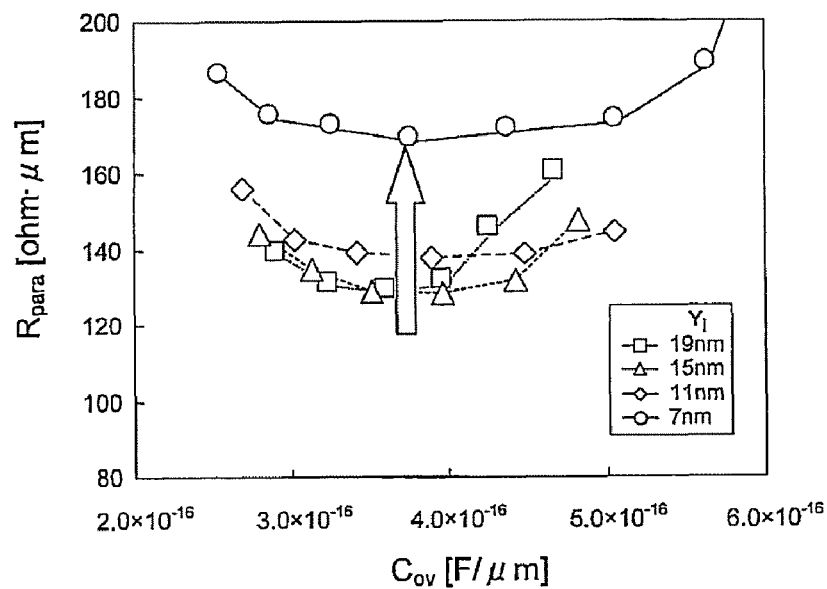
FIG. 5B is a graph showing a relationship between the Rpara and Cov in accordance with a comparative example.

FIGS. 5A and 5B show a comparative example which the diffusion restraining layer is in contact with both of the side surface 161a and bottom surface 161b. as shown in FIGS. 5A and 5B, DIBL is reduced but parasitic resistance Rpara is increased.

Second Embodiment

A second embodiment of the present invention will be explained hereinafter with reference to FIGS. 6-7F.

In this second embodiment, a Si based crystalline layer 21 formed on the diffusion restraining layer 15 and a fixed charge restraining layer 20 formed under the diffusion restraining layer 15 are formed. An explanation of the same portion as the first embodiment is omitted in this second embodiment.

Figure 6:
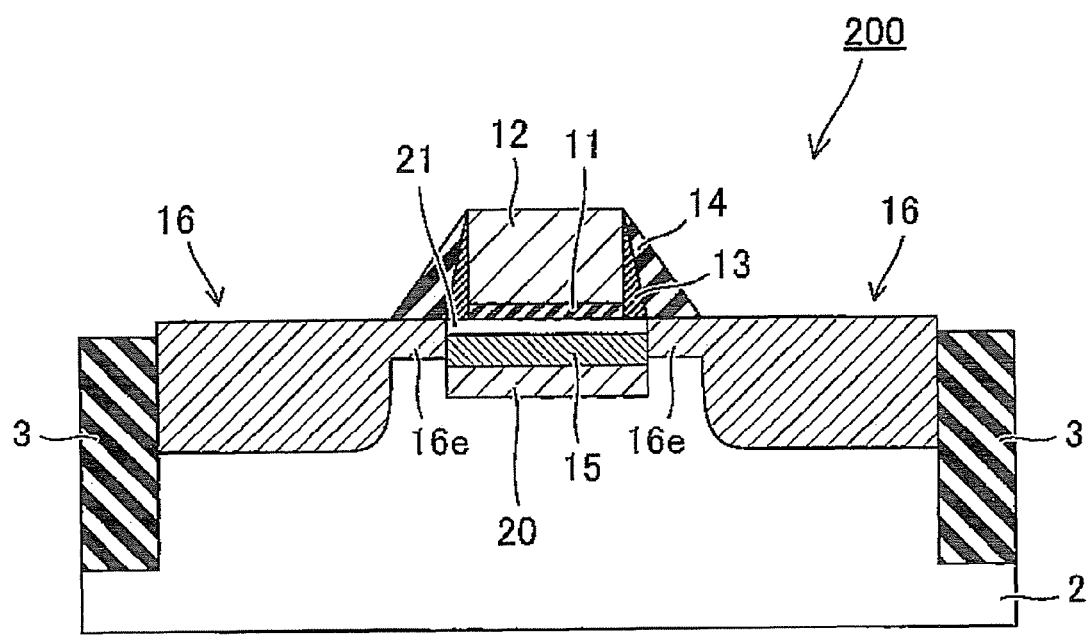
FIG. 6 is a cross sectional view of a semiconductor device in accordance with a second embodiment of the present invention.

FIG. 6 is a cross sectional view of a semiconductor device 200 of the second embodiment.

In the semiconductor device 200, the STI 3, gate insulating layer 11, gate electrode 12, offset spacer 13, gate sidewall 14, diffusion restraining layer 15, Si based crystalline layer 21 on the diffusion restraining layer 15, fixed charge restraining layer 20 under the diffusion restraining layer 15 and source/drain region 16 are formed.

A fixed charge is generated in case a channel is formed in a C included Si based crystalline. An impurity for suppressing a generation of the fixed charge is included in the fixed charge restraining layer 20. The impurity for suppressing a generation of the fixed charge is B, N, F or the like. The fixed charge restraining layer 20 is in contact with the diffusion restraining layer 15. The fixed charge restraining layer 20 may be formed on the upper surface of the diffusion restraining layer 15 and with overlapping to the diffusion restraining layer 15.

The Si based crystalline layer 21 is a layer which does not include C and functions as a channel of the transistor. The Si based crystalline layer 21 may contain a small amount of C, which is diffused from the diffusion restraining layer 15. So, the c concentration in the Si based crystalline layer 21 is less than the diffusion restraining layer 15. The fixed charge in the semiconductor device 200 is reduced with comparing to a transistor in which the diffusion restraining layer 15 is used as a channel.

A manufacturing process of the semiconductor device 200 will be explained with reference to FIGS. 7A-7F.

Figure 7A:
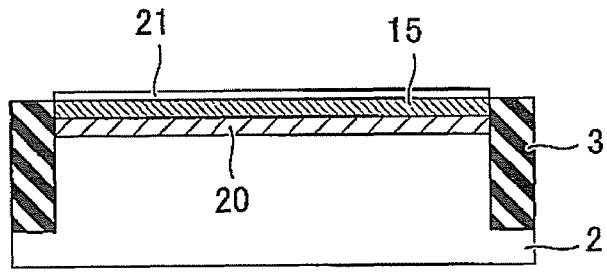
FIGS. 7A-7F are cross sectional views showing a manufacturing process of a semiconductor device in accordance with a second embodiment of the present invention.

As shown in FIG. 7A, the STI 3 is formed in the semiconductor substrate 2. After that, the fixed charge restraining layer 20, diffusion restraining layer 15 and Si based crystalline layer 21 are formed in this order.

The fixed charge restraining layer 20 and diffusion restraining layer 15 are formed by ion implanting to in-situ doping epitaxial growth. The Si based crystalline layer 21 is formed by an epitaxial growth. Later that, a well region and a channel region (not shown) are formed by implanting a conductive impurity.

Figure 7B:
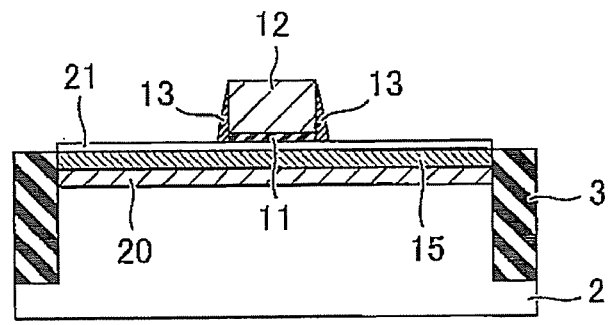

As shown in FIG. 7B, the gate insulating layer 11, gate electrode 12 and offset spacer 13 are formed.

Figure 7C:
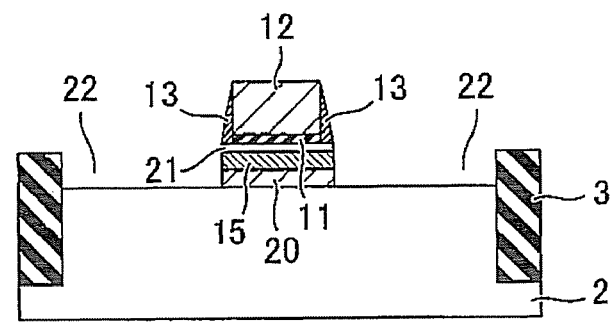

As shown in FIG. 7C, a trench 22 is formed by removing an exposed portion of the fixed charge restraining layer 20, diffusion restraining layer 15 and Si based crystalline layer 21.

Figure 7D:
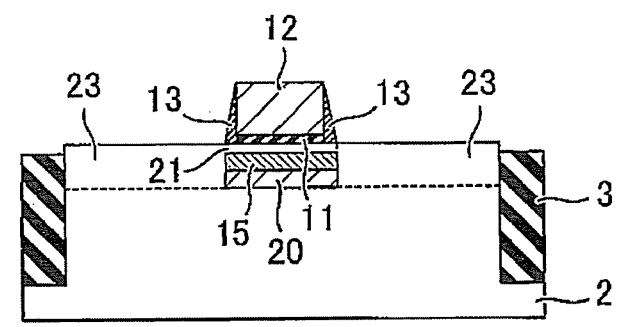

As shown in FIG. 7D, an epitaxial growth layer 23 is formed by growing a Si crystal from the trench 22.

Figure 7E:
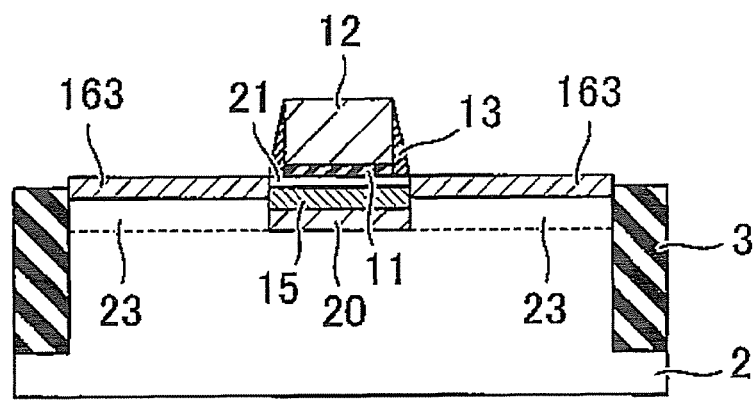

As shown in FIG. 7E, a shallow region 163 of the source/drain region 16 is formed by ion implantation. The shallow region 163 is not formed in the diffusion suppression layer 15.

After forming the shallow region 163 of the source/drain region 16, annealing for activating the conductive impurity in the shallow region 163 may be provided. A horizontal diffusion of the conductive impurity is suppressed by the diffusion restraining layer 15. A vertical diffusion of the conductive impurity is not suppressed.

Figure 7F:
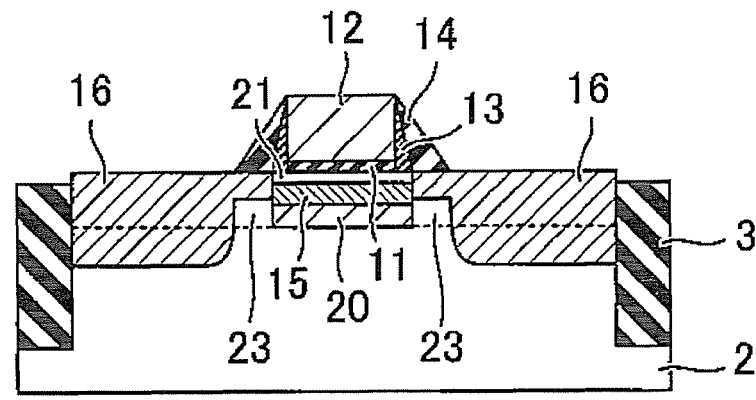

As shown in FIG. 7F, the gate sidewall layers 14 are formed on the semiconductor substrate 2 and a side of the offset spacer 13. After that, a deep layer 162 of the source/drain region 16 is formed by the gate electrode 12, offset spacer 13 and the sidewall layers 14 as mask. The region 161 of the source/drain region 16 where the deep region 162 is not formed is the extension region of the source/drain region 16.

In accordance with this embodiment, a short channel effect is suppressed as explained in the first embodiment.

A fixed charge is reduced by the fixed charge restraining layer 20. A fixed charge based on the C in the diffusion restraining layer 15 is reduced by the Si based crystalline layer 21, since the Si based crystalline layer 21 is used as a channel of transistor 200.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a gate electrode formed on a semiconductor substrate via an insulating layer;
a source region formed in the semiconductor substrate and including an extension region in a side closer to the gate electrode and a conductive impurity, the extension region including a side surface facing a horizontal direction and a bottom surface facing a vertical direction;
a drain region formed in the semiconductor substrate and including an extension region in a side closer to the gate electrode and the conductive impurity, the extension region including a side surface facing the horizontal direction and a bottom surface facing a vertical direction;
a first diffusion restraining layer formed in the semiconductor substrate, configured to prevent a diffusion of the conductive impurity in the source region, and including an impurity other than the conductive impurity, the first diffusion restraining layer being in contact with the side surface of the extension region of the source region and not in contact with the bottom surface of the extension region of the source region; and
a second diffusion restraining layer formed in the semiconductor substrate and configured to prevent a diffusion of the impurity in the drain region, and including the impurity other than the conductive impurity, the second diffusion restraining layer being in contact with the side surface of the extension region of the drain region and not in contact with the bottom surface of the extension region of the drain region.

2. The semiconductor device of claim 1, wherein an impurity concentration distribution of the conductive impurity in the side surface of the extension region of the source region to the horizontal direction is steeper than an impurity concentration distribution of the conductive impurity in the bottom surface of the extension region of the source region to the vertical direction.

3. The semiconductor device of claim 1, wherein an impurity concentration distribution of the conductive impurity in the side surface of the extension region of the drain region to the horizontal direction is steeper than an impurity concentration distribution of the conductive impurity in the bottom surface of the extension region of the drain region to the vertical direction.

4. The semiconductor device of claim 1, wherein an impurity concentration distribution of the conductive impurity in the side surface of the extension region of the source region to the horizontal direction is steeper than an impurity concentration distribution of the conductive impurity in the bottom surface of the extension region of the source region to the vertical direction, and an impurity concentration distribution of the conductive impurity in the side surface of the extension region of the drain region to the horizontal direction is steeper than an impurity concentration distribution of the conductive impurity in the bottom surface of the extension region of the drain region to the vertical direction.

5. The semiconductor device of claim 4, wherein the conductive impurity is B or P, and the impurity in the first diffusion restraining layer and the second diffusion restraining layer is C.

6. The semiconductor device of claim 1, wherein the conductive impurity is B or P, and the impurity in the first diffusion restraining layer and the second diffusion restraining layer is C.

7. The semiconductor device of claim 1, wherein the conductive impurity is As, and the impurity in the first diffusion restraining layer and the second diffusion restraining layer is Xe.

8. The semiconductor device of claim 1, wherein the first diffusion restraining layer and the second diffusion restraining layer are connected.

9. The semiconductor device of claim 1, further comprising,
a Si based crystalline layer formed on the first diffusion restraining layer and the second diffusion restraining layer, and configured to function as a channel.

10. The semiconductor device of claim 1, further comprising,
a fixed charge restraining layer formed under the first diffusion restraining layer and the second diffusion restraining layer with being contact with the first diffusion restraining layer and the second diffusion restraining layer, and configured to reducing an occurrence of a fixed charge based on the impurity in the first diffusion restraining layer or the second diffusion restraining layer.

* * * * *